(12) United States Patent
Taniguchi et al.

(10) Patent No.: US 10,944,236 B2
(45) Date of Patent: Mar. 9, 2021

(54) OPTICAL UNIT, FIXING MECHANISM FOR OPTICAL UNIT, AND SEMICONDUCTOR LASER MODULE

(71) Applicant: FURUKAWA ELECTRIC CO., LTD., Tokyo (JP)

(72) Inventors: Hidehiro Taniguchi, Tokyo (JP); Junji Yoshida, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/622,897

(22) Filed: Jun. 14, 2017

(65) Prior Publication Data

US 2017/0288367 A1 Oct. 5, 2017

Related U.S. Application Data

(63) Continuation of application No. PCT/JP2015/085716, filed on Dec. 21, 2015.

(30) Foreign Application Priority Data

Dec. 25, 2014 (JP) .............................. JP2014-263063

(51) Int. Cl.
*H01S 5/022* (2006.01)
*H01S 5/024* (2006.01)
(Continued)

(52) U.S. Cl.
CPC .......... *H01S 5/02256* (2013.01); *H01S 5/024* (2013.01); *H01S 5/02248* (2013.01);
(Continued)

(58) Field of Classification Search
CPC ................................................. H01S 5/02256
See application file for complete search history.

(56) References Cited

U.S. PATENT DOCUMENTS 5,872,803 A * 2/1999 Mori ....................... H01S 3/025
 372/75
8,483,249 B1 * 7/2013 Govorkov ........... H01S 5/02264
 372/34

(Continued)

FOREIGN PATENT DOCUMENTS

CN 102052608 A 5/2011
CN 201868729 U 6/2011
(Continued)

OTHER PUBLICATIONS

International Search Report issued in PCT/JP2015/085716, dated Mar. 22, 2016.
(Continued)

*Primary Examiner* — Tod T Van Roy
(74) *Attorney, Agent, or Firm* — Marshall, Gerstein & Borun LLP (57) ABSTRACT

A circuit conductor is provided on a base. A semiconductor laser is connected to the circuit conductor. Cutout parts on which the circuit conductor is not formed are provided at, for example, the vicinity of the four corners of the base, and a hole is provided at each of the said portions. The holes penetrate the base. Fixing members are inserted through the holes. The fixing members are, for example, male threads. Since the head part of the fixing members is located in the cutout part, the fixing members and the circuit conductor are not in contact with each other. A platform has holes formed at portions corresponding to the holes in the optical unit and female threads formed on the inner surface. The fixing members and the platform are therefore joined. As a result, the optical unit is fixed to the platform.

10 Claims, 7 Drawing Sheets

(51) Int. Cl.
*H01S 5/0683* (2006.01)
*H01S 5/40* (2006.01)
*H01S 5/02216* (2021.01)

(52) U.S. Cl.
CPC ........ *H01S 5/02284* (2013.01); *H01S 5/0683* (2013.01); *H01S 5/4012* (2013.01); *H01S 5/4075* (2013.01); *H01S 5/02216* (2013.01); *H01S 5/02288* (2013.01); *H01S 5/02476* (2013.01); *H01S 5/4025* (2013.01)

(56) References Cited

U.S. PATENT DOCUMENTS

| | | | | |
|---|---|---|---|---|
| 2007/0115617 A1* | 5/2007 | Schulte | ............... | H01S 5/02236 361/671 |
| 2007/0116074 A1* | 5/2007 | Schulte et al. | ...... | H01S 5/02252 372/36 |
| 2008/0063017 A1* | 3/2008 | Schnitzler | ............. | H01S 5/4025 372/35 |
| 2008/0291955 A1* | 11/2008 | Schulte | ............... | H01S 5/02252 372/36 |
| 2011/0096543 A1* | 4/2011 | Yabe | .................... | G02B 6/4201 362/235 |
| 2012/0081893 A1* | 4/2012 | Faybishenko | ........ | G02B 6/4296 362/235 |
| 2014/0072007 A1 | 3/2014 | Taniguchi et al. | | |
| 2014/0079507 A1* | 3/2014 | Brunner | ................ | F16B 11/006 411/82 |
| 2016/0079728 A1 | 3/2016 | Matsuyama et al. | | |

FOREIGN PATENT DOCUMENTS

| | | |
|---|---|---|
| CN | 102916341 A | 2/2013 |
| JP | 2003060282 A | 2/2003 |
| JP | 2007201285 A | 8/2007 |
| JP | 2008053380 A | 3/2008 |
| JP | 2008-090209 A | 4/2008 |
| JP | 2009-004701 A | 1/2009 |
| JP | 2013012708 A | 1/2013 |
| WO | WO-2014/192944 A1 | 12/2014 |
| WO | WO-2014192988 A1 | 12/2014 |

OTHER PUBLICATIONS

Office Action issued in Chinese Patent Application No. 201580063624.0 dated Nov. 28, 2018.
Office Action issued in Japanese Patent Application No. 2014-263063 dated May 1, 2019.
Office Action issued in Chinese Patent Application No. 201580063624.0 dated Jun. 28, 2019.
Office Action issued in Chinese Patent Application No. 201580063624.0 dated Aug. 27, 2020.

* cited by examiner

OPTICAL UNIT, FIXING MECHANISM FOR OPTICAL UNIT, AND SEMICONDUCTOR LASER MODULE

TECHNICAL FIELD

This disclosure relates to an optical unit including a semiconductor laser that is fixed on a base, and the like.

BACKGROUND

There are semiconductor laser modules in which light emitted from semiconductor lasers is coupled to optical fibers. For such semiconductor laser modules, an optical unit in which a semiconductor laser is fixed on a base (submount) is used (Patent Document 1, for example).

An optical unit is usually fixed to a platform, a package, or a cooling device by soldering. Thus, it has been impossible to remove the optical unit once it was assembled in a semiconductor laser module. So, if there is a trouble with an optical unit, the whole semiconductor laser module has to be replaced. Especially, when one optical unit breaks down in a semiconductor laser module having a plurality of optical units, it has been impossible to replace only the failed optical unit.

SUMMARY OF THE DISCLOSURE

The presently described embodiments were achieved in view of such problems. Its object is to provide an optical unit that can be easily attached or detached, and the like.

To achieve the above object, a first embodiments includes an optical unit including a base and a semiconductor laser that is disposed on the base. Holes through which fixing members can be inserted are formed on the base.

It is preferable that a lens that collimates light emitted from the semiconductor laser is joined to the optical unit.

A metal layer may be exposed on a surface of the base around the hole and the metal layer may be insulated from circuit patterns on the base.

The holes are preferably disposed on both sides of the semiconductor laser.

According to the first embodiment, holes for fixing members are formed on a base so that the base can be fixed to a platform with the fixing members. Thus, it is unnecessary to fix the base to the platform with solder. For this reason, compared to conventional solder joint, materials for the base and the platform can be chosen without considering much about the difference in the thermal expansion coefficients thereof. Also, since the optical unit is fixed to the platform or the like with the fixing members, the optical unit can be attached or detached. Thus, the optical unit can be easily replaced.

Also, a lens is joined to the optical unit in one body, so this further facilitates replacing of the optical unit.

Also, with a metal layer exposed around the hole, a bearing surface of the fixing member contacts with the metal layer when the fixing member is inserted into the hole. Thus, the metal layer acts as a metal washer and prevents slack of the fixing member.

A second embodiment includes a fixing mechanism for an optical unit in which an optical unit including a base and a semiconductor laser disposed on the base, or an optical unit with a platform in which a platform is joined to the optical unit, is used. Holes through which fixing members can be inserted are formed on the base or the platform, and the optical unit is fixed to the platform, a package, or a cooling device with the fixing members, or the optical unit with a platform is fixed to the package or the cooling device with the fixing members.

According to the second embodiment, the optical unit can be easily attached to or detached from the platform or the like and there is no fear of solder damage or the like.

A third embodiment includes a semiconductor laser module including the optical unit according to the first embodiment, an optical fiber to which the laser beams emitted from the semiconductor laser are coupled, and a package that accommodates the optical unit. The optical unit is directly or indirectly fixed to the package with the fixing members.

The semiconductor laser module may further include a plurality of the optical units that are accommodated in the package, a plurality of reflective mirrors that reflect laser beams emitted from each of the semiconductor lasers respectively, and a condensing lens that condenses the laser beams reflected by the plurality of the reflective mirrors. Each of the plurality of the optical units may be individually attached or detached.

A thermo-conductive sheet may be disposed on a bottom face of the base and the optical unit may contact a connection target via the thermo-conductive sheet.

The optical fiber is preferably a multi-mode optical fiber.

According to the third embodiment, the optical unit can be easily attached to or detached from the platform or the like and there is no fear of solder damage or the like. In particular, when a plurality of the optical units are disposed and one of the optical units is broken, the optical unit can be replaced easily.

Also, disposing a thermo-conductive sheet between the bottom face of the base and the platform or the like can increase heat dissipation of the base.

Also, if both the semiconductor laser and the optical fiber are for the multi-mode use, high accuracy in alignment is not required compared to the case with the single-mode use, so slight misalignment of cores caused by fixing with the fixing members is tolerable.

The presently described embodiments can provide an optical unit that can be easily attached or detached, and the like.

BRIEF DESCRIPTION OF DRAWINGS

FIG. 3b is a cross sectional view taken along A-A line in FIG. 3a.

FIG. 4b is a cross sectional view taken along B-B line in FIG. 4a.

FIG. 7 is a front view showing a fixing mechanism for an optical unit with a platform 23a.

FIG. 8 is a cross sectional view showing a semiconductor laser module 1a.

DETAILED DESCRIPTION

Figure 1:
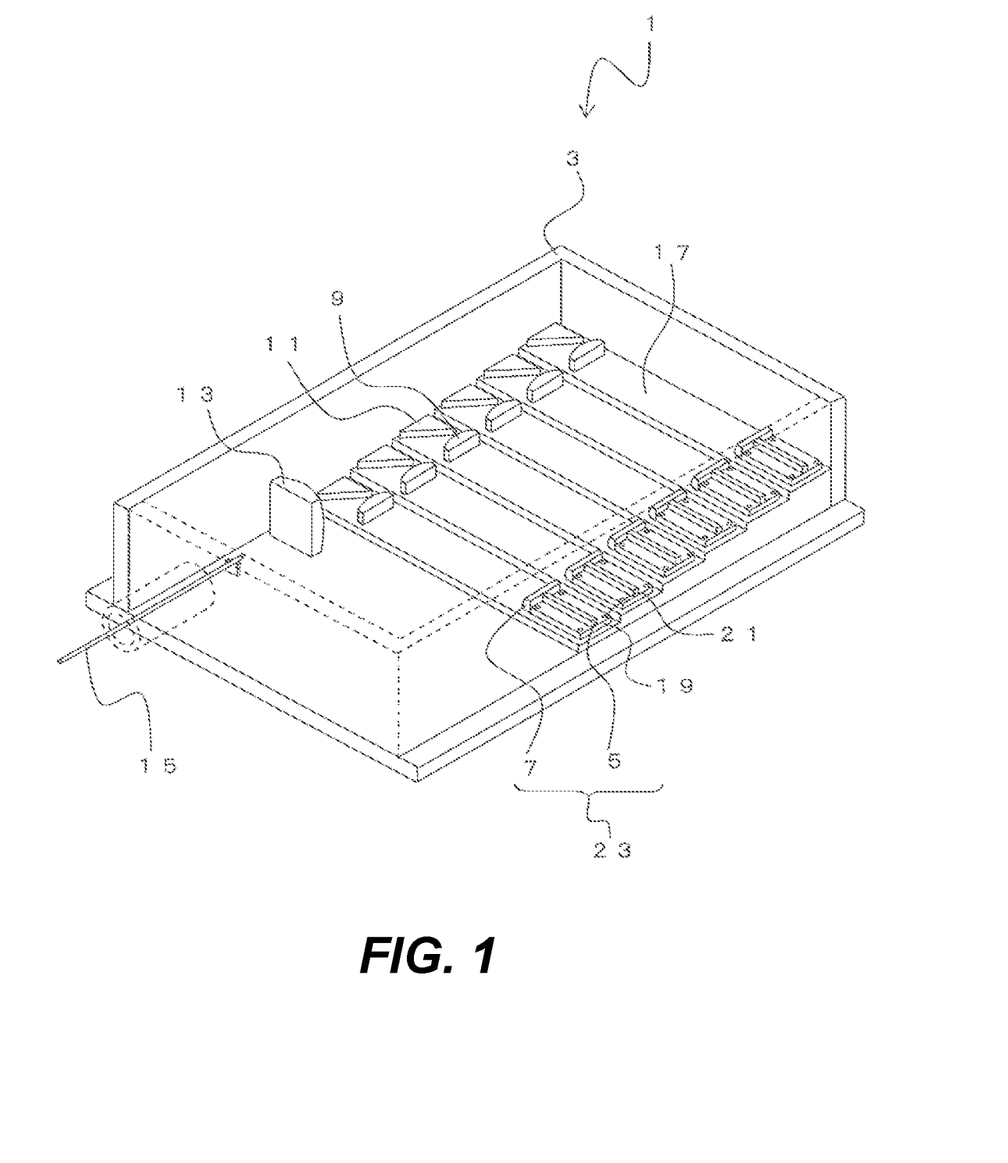
FIG. 1 is a perspective view showing a semiconductor laser module 1.
Figure 2:
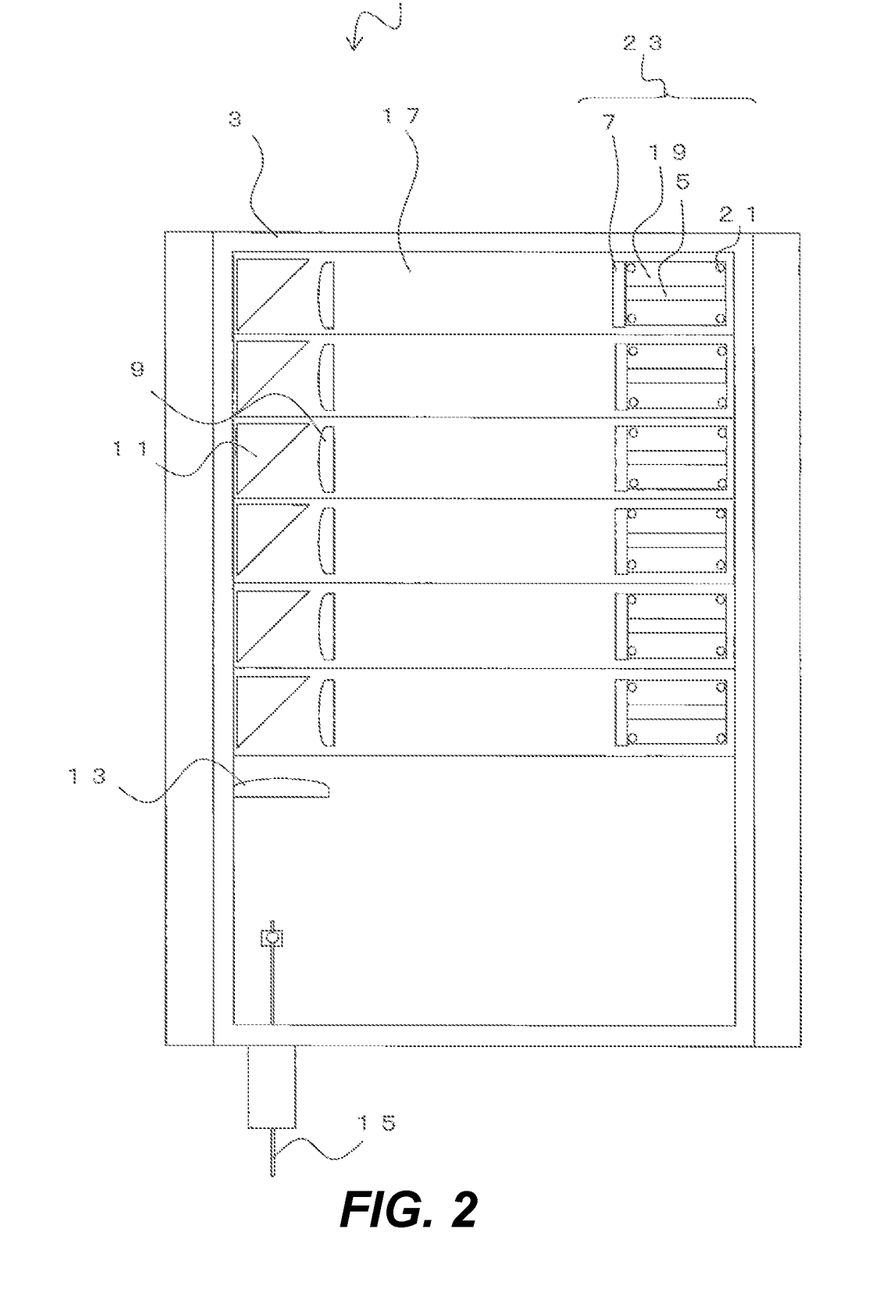
FIG. 2 is a plan view showing the semiconductor laser module 1.

Hereinafter, a first embodiment will be described with reference to the accompanying drawings. FIG. 1 is a drawing showing a semiconductor laser module 1, and FIG. 1 is a perspective view and FIG. 2 is a plan view. In FIG. 1, an upper surface and side walls on the front in the drawing of a package 3 are shown as perspective. The semiconductor laser module 1 mainly includes a package 3, lenses 7, 9, and 13, reflective mirrors 11, an optical fiber 15, platforms 17, optical units 23, and so on.

The package 3 includes a bottom portion and side walls. The package 3 is made of, for example, copper, copper alloy, aluminum, ceramics with high thermo-conductivity (such as aluminum nitride: AlN or beryllium oxide: BeO), or the like.

The platforms 17 are formed in a form of stairs with increasing heights inside the package 3. Each step becomes an installing surface for the optical unit 23. The package 3 and the platforms 17 may be made of different materials separately, or the bottom portion of the package 3 may be formed as stairs to make the package 3 and the platforms 17 in one body. Also, the optical units 23 may be directly fixed onto the package 3. In such a case, the bottom portion of the package 3 becomes the installing surface for the optical unit 23. That is, the optical unit 23 is fixed to the package 3 directly or indirectly. Hereinafter, examples in which the optical unit 23 is disposed on the platform 17 will be described.

The optical unit 23 (a chip on submount: COS) is fixed on each of the platforms 17. The optical unit 23 includes a base 19 (submount), a semiconductor laser 5, the lens 7, and so on. The semiconductor laser 5 is fixed onto the base 19. Also, the lens 7 is fixed at an end face of the base 19 on the front side (light emitting direction) of the semiconductor laser 5. A method for fixing the optical unit 23 to the platform 17 will be described below.

The lens 9 is disposed in further front of the lens 7 of the optical unit 23. The lenses 7 and 9 collimate the light emitted from the semiconductor laser 5 in vertical and horizontal directions, respectively. The lens 7 may be fixed to the end face of the base 19 after adjusting the alignment of its position toward the semiconductor laser 5.

An optical unit equipped with a collimate lens is preferable because the allowance for position shifting against the coupling efficiency is high in fixing the optical unit to the platform 17. It is also preferable because there is no shifting in coupling of the optical unit 23 and the lens 7 in attaching or detaching the optical unit 23.

The reflective mirror 11 is fixed in front of the lens 9. The reflective mirror 11 reflects the light collimated by the lenses 7 and 9 substantially at a right angle. The lenses 7 and 9 and the reflective mirror 11 are disposed for each of the semiconductor lasers 5 and are disposed on the platform 17.

The lens 13 (a condensing lens) then condenses the laser beams reflected by the reflective mirrors 11. The lens 13 is fixed on the bottom portion of the package 3. Also, the optical fiber 15 is provided in front of the lens 13 so as to penetrate the package 3. The laser beams condensed by the lens 13 are coupled to the optical fiber 15.

That is, a plurality of the optical units 23 are provided side by side on the platforms 17 with different heights, and each emits a laser beam in the substantially same direction. In the direction of the emission of the semiconductor lasers 5, the lens 7, the lens 9, and the reflective mirror 11 are disposed in sequence in the same direction. Thus, the laser beams irradiate the reflective mirrors 11 via the lenses 7 and 9. Furthermore, each of the reflective mirrors 11 reflects the laser beam in the substantially same direction. The laser beams reflected by each of the reflective mirrors 11 are condensed by the lens 13 and coupled to the optical fiber 15.

Here, it is preferable that the optical fiber 15 is a multi-mode optical fiber. A multi-mode optical fiber has a larger core diameter than a single-mode optical fiber (100 μm to 200 μm, for example), so the alignment of the cores is easier and the allowance for core shifting is larger. It is also preferable that the semiconductor laser 5 has a low deterioration in its characteristics when being driven at high temperature. As such a semiconductor laser, for example, the semiconductor laser 5 includes a quantum well layer and a barrier layer or a light guide layer, in which the barrier layers or the light guide layers are formed so as to interpose the quantum well layer in the thickness direction and have a band gap energy that is 100 meV or larger than that of the quantum well layer.

The number or the arrangement of the optical units 23 is not limited to the examples shown in the drawings. However, the presently described embodiments can be preferably applied to a case in which the semiconductor laser module 1 includes a plurality of the optical units 23. With a plurality of the optical units 23 provided, it is impossible to replace only the broken optical unit 23 if the optical units 23 are fixed by soldering in conventional ways. However, the presently described embodiments enable to replace only the broken optical unit 23. Also, if the reflective surface of the reflective mirror 11 is formed in a curved or spherical surface or the like and the reflective mirror 11 can collimate the laser beams emitted from the semiconductor laser 5 spreading vertically or horizontally, the corresponding lenses 7 and 9 are not always necessary.

Figure 3A:
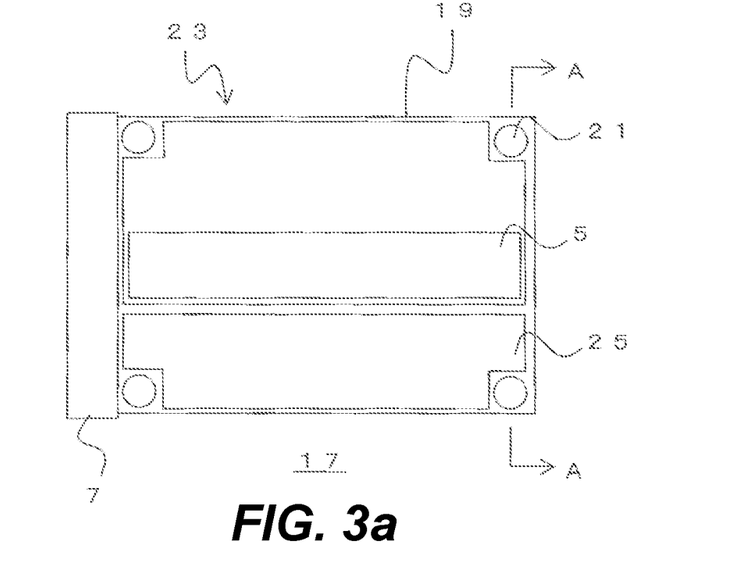
FIG. 3a is a plan view showing an optical unit 23.
Figure 3B:
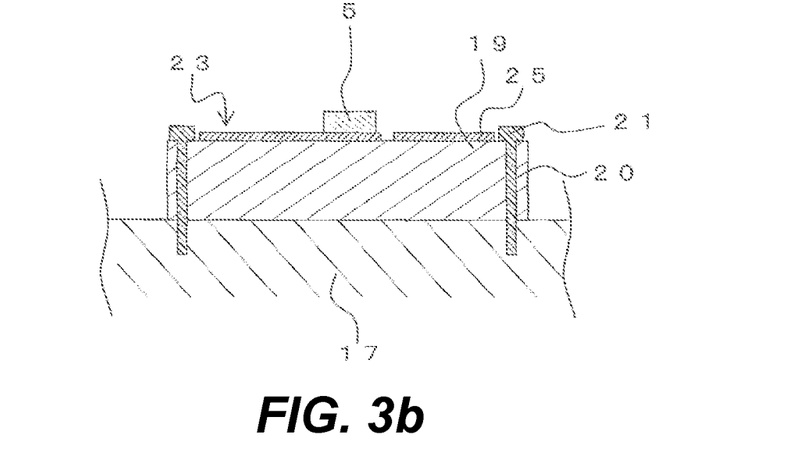

FIG. 3a is a plan view showing the optical unit 23 and FIG. 3b is a cross sectional view taken along A-A line in FIG. 3a. A circuit conductor 25 is provided on an upper surface of the base 19. The semiconductor laser 5 is connected to the circuit conductor 25. A pair of the circuit conductors 25 are formed with a distance in between thereof and each is electrically connected with terminal portions on both front and back sides of the semiconductor laser 5. Lead wires or the like that connect the semiconductor laser 5 with the circuit conductors 25 are omitted in the drawing.

Although a conventional material such as aluminum nitride may be used for the base 19, other materials may also be used. When fixing the optical unit 23 with solder in conventional ways, the solder may break due to excess stress applied by thermal expansion in use if a combination of materials with a large difference in thermal expansion coefficients are chosen for the base and the platform. Thus, there have been no other options for the materials of the base and the like but to use comparatively expensive aluminum nitride of which surface is plated with gold.

However, it is unnecessary to consider such thermal expansion coefficient difference and the gold plating or the like is also unnecessary.

Thus, there are greater choices for the materials of the base and it is possible to choose a cheaper material or to obtain an optical unit with a high cooling efficiency. That is, it is possible to obtain an optical unit that may not break even with a combination of materials of the optical unit and the platform or the like with a large thermal expansion coefficient difference.

Hereinafter, a fixing method for the optical unit 23 and the platform 17 will be described. In the descriptions below, a case in which the base 19 is an insulator will be described first.

Cutout parts on which the circuit conductor 25 is not formed are provided in the vicinity of the four corners, for example, of the base 19, and a hole 20 is provided at each of the cutout parts (FIG. 3b). The holes 20 penetrate the base 19. Fixing members 21 are inserted into the holes 20. The fixing members 21 are, for example, male threads. Since the head parts of the fixing members 21 are located in the cutout parts, the fixing members 21 and the circuit conductor 25 are not in contact with each other. That is, the circuit conductor 25 (the circuit patterns) is insulated from the fixing members 21.

If the fixing members 21 are formed of a high thermo-conductive member such as copper or aluminum, high heat dissipation can be obtained. Or, if the fixing members 21 are formed of an insulating member, then there is no need to make part of the circuit conductor 25 into the cutout parts.

The platform 17 has holes formed at portions corresponding to the holes 20 in the optical unit 23, and female threads are formed on the inner faces thereof. Thus, the fixing members 21 and the platform 17 can be joined together. Consequently, the optical unit 23 is fixed on the platform 17. In a case in which the optical unit 23 is directly fixed on the package 3, the female threads that can be connected with the fixing members 21 should be provided in the package 3. Also, although drawings are omitted, when the optical unit 23 is fixed on a cooling device, the female threads that can be connected with the fixing members 21 should be provided in the cooling device (hereinafter, the object on which the optical unit 23 is fixed will be simply called as 'the platform 17 or the like').

Solder or adhesive agent may be applied onto the periphery of the fixing members 21 in advance so as to prevent the fixing members 21 from loosening.

As above, the optical unit 23 is fixed to the platform 17 or the like with the fixing members 21. Thus, the optical unit 23 can be easily attached to or detached from the platform 17. Thus, when the optical unit 23 is broken, it is possible to replace only the broken optical unit 23.

Also, it is unnecessary to use solder or adhesive agents to join the optical unit 23 and the platform 17 or the like together. Thus, since no solder nor adhesive agent is used, even with a large difference in thermal expansion coefficients between the materials of the base 19 and the platform 17 or the like, there will be no excess stress applied to solder or the like and thus there is no fear of the optical unit 23 dropping off or deterioration in heat dissipation.

Also, high thermo-conductive materials such as metals, carbon, or diamond may be used for the base 19. That is, it is possible to apply the materials that used to be difficult to apply since solder joint is difficult or the difference of the thermal expansion coefficients with the platform 17 or the like is too large. Choosing such materials makes it possible to obtain the optical unit 23 that excels in heat dissipation, for example. This, consequently, makes it possible to apply the semiconductor laser 5 with higher output.

If a conductive material is applied as the material for the base 19, the structure should be formed in such a manner that the circuit conductor 25 and the base 19 or the platform 17 are not electrically connected. For example, an insulating layer may be formed between the circuit conductor 25 and the base 19, or, an insulating layer may be formed between the base 19 and the platform 17. If the circuit conductor 25 and the base 19 are electrically connected, then the fixing members 21 should be made of insulating materials or coated for insulation.

Figure 4A:
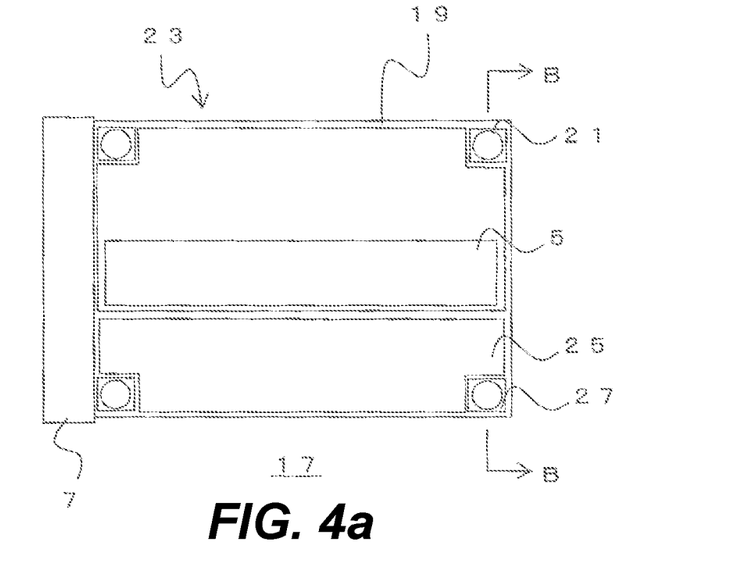
FIG. 4a is a plan view showing a second embodiment of the optical unit 23.
Figure 4B:
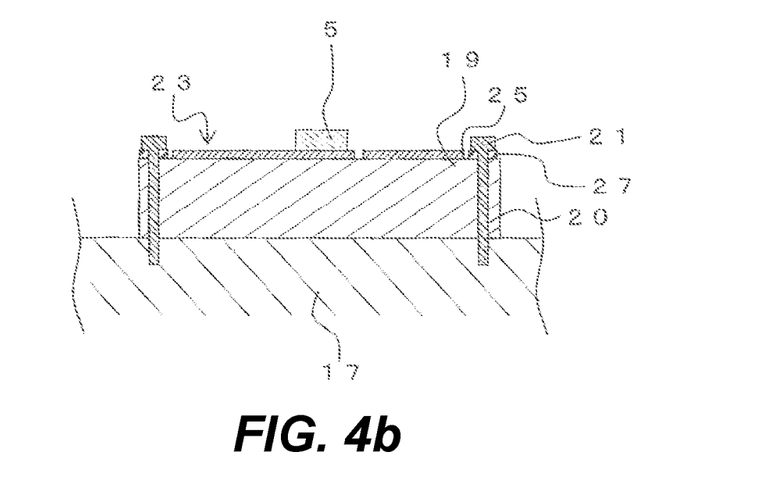

Other embodiments will be described below. In the descriptions hereinafter, the same notations will be used for the structures that have the same functions as in the above embodiment and redundant descriptions will be omitted. FIG. 4a is a plan view of the optical unit 23 and FIG. 4b is a cross sectional view taken along B-B line in FIG. 4a.

In a second embodiment, metal layers 27 are formed on the cutout parts of the circuit conductor 25 that are formed in the vicinity of the four corners of the base 19. There are gaps formed between the metal layers 27 and the circuit conductor 25, so the metal layers 27 and the circuit conductor 25 are not electrically connected with each other.

The bearing surface of the fixing member 21 is in contact with the metal layer 27. Thus, when the fixing member 21 is screwed in, the metal layer 27 exposed around the hole acts as a washer for the fixing member 21. The metal layer 27 is preferably softer than the material of the base 19. Also, since the metal layer 27 is insulated from the circuit conductor 25, the fixing member 21 is never electrically connected with the circuit conductor 25. Also, the metal layer 27 and the circuit conductor 25 may be formed of the same material. In this way, the metal layer 27 and the circuit conductor 25 can be formed at the same time.

According to the second embodiment, the same effects as in the first embodiment can be obtained. Also, the metal layers 27 can be used as the washers for the fixing members 21, preventing the fixing members 21 from loosening.

Figure 5:
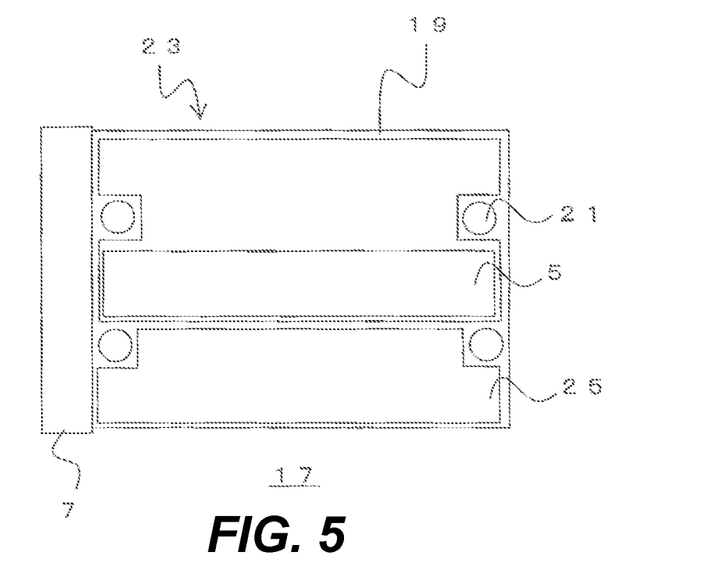
FIG. 5 is a plan view showing a third embodiment of the optical unit 23.

Next, a third embodiment will be described. FIG. 5 is a plan view of the optical unit 23 according to the third embodiment. In the third embodiment, the fixing positions of the fixing members 21 are different from the above embodiments.

In the example shown in FIG. 5, the fixing members 21 are disposed on both sides of the semiconductor laser 5. The "both sides of the semiconductor 5" are the parts that are close to the semiconductor laser 5 and, for example, are the positions that are closer to the semiconductor laser 5 than the center of the distance between the side portion of the semiconductor laser 5 and the side portion of the base 19. That is, the fixing members 21 are disposed not in the vicinity of the four corners of the base 19 but in the vicinity of the semiconductor laser 5.

In this case, the cutout parts of the circuit conductor 25 are formed on the fixing positions of the fixing members 21. That is, the fixing members 21 are insulated from the circuit conductor 25. The metal layers 27 may also be formed on the cutout parts.

According to the third embodiment, the same effects as in the first embodiment can be obtained. Also, disposing the fixing members 21 in the vicinity of the semiconductor laser 5 enables to suppress the influence of thermal expansion of the base 19 on the semiconductor laser 5.

Figure 6:
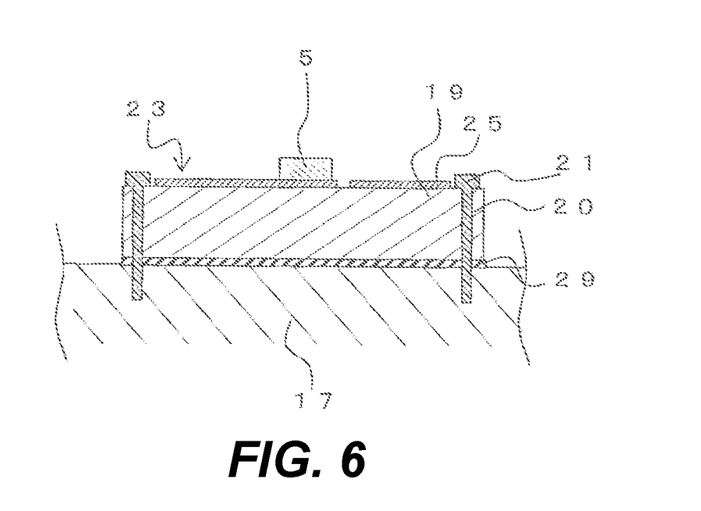
FIG. 6 is a cross sectional view showing a fixing mechanism of a fourth embodiment of the optical unit 23.

Next, a fourth embodiment will be described. FIG. 6 is a cross sectional view of the optical unit 23 according to the fourth embodiment. The fourth embodiment differs from the above embodiments in that a thermo-conductive sheet 29 is disposed.

In the example shown in FIG. 6, the thermo-conductive sheet 29 is interposed between the base 19 and the platform 17 over the substantially entire surface of the base 19. The fixing members 21 penetrate the base 19 and the thermo-conductive sheet 29, and are joined with the platform 17 or the like (the connection target) below. The thermo-conductive sheet 29 is, for example, a carbon sheet. Or, if a conductive material is applied as the material for the base 19, the thermo-conductive sheet 29 should be an insulator.

According to the fourth embodiment, the same effects as in the first embodiment can be obtained. Also, disposing the thermo-conductive sheet 29 beneath the base can further increase the heat dissipation from the base 19 to the platform 17 or the like.

Figure 7:
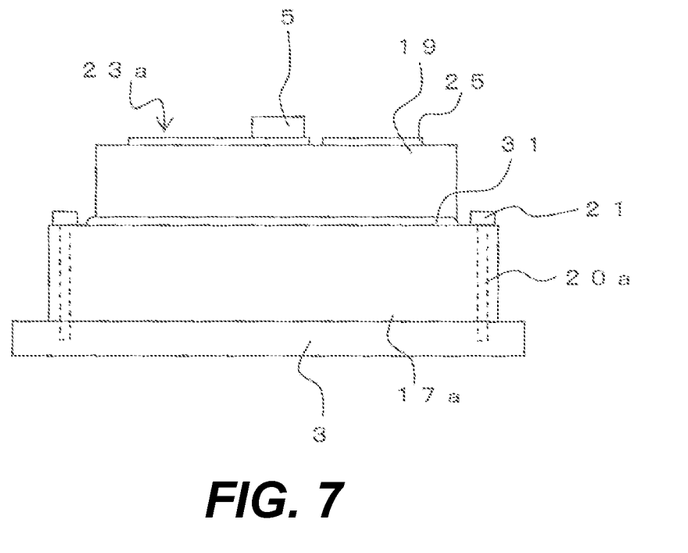

Next, a fifth embodiment will be described. FIG. 7 is a front view of an optical unit with a platform 23a according to the fifth embodiment. The fifth embodiment differs in that the fixing members 21 do not fix the base 19 on the platform 17 or the like but the fixing members 21 fix the platform 17a to the package 3.

In the above-mentioned embodiments, the base 19 has the holes 20 provided and the fixing members 21 are inserted through the holes 20 to fix the base 19 to the platform 17 or the like. However, for the optical unit 23 of smaller size or the one without the space for the holes 20, the optical unit with a platform 23a, in which a sub platform 17a is provided at the lower part of the optical unit, can be applied. That is, the optical unit with a platform 23a according to the present embodiment includes an optical unit that is fixed to the platform 17a with a solder 31, and the platform 17a has holes 20a provided at the positions that do not interfere with the base 19.

The fixing members 21 are inserted through the holes 20a and joined with the package 3, which is the connection target. That is, the fixing members 21 fix the optical unit with a platform 23a to the package 3. Thus, solder or adhesive agents are not required to fix the optical unit with a platform 23a to the package 3.

Alternatively, the optical unit with a platform 23a may be fixed to the cooling device, whose drawing is omitted, instead of the package 3.

According to the fifth embodiment, the same effects as in the first embodiment can be obtained. Also, the optical unit with a platform 23a can be easily attached or detached by removing the fixing members 21. Also, in the present embodiment, the base and the platform 17a can be made of materials with high heat conductivity (such as metal). Thus, greater heat dissipation can be obtained.

The optical unit 23 and the optical unit with a platform 23a mentioned above are not limited to the case in which a plurality of the optical units are provided side by side as in the semiconductor laser module 1 shown in FIG. 1. The present concepts can be applied to a case in which one optical unit is disposed as in a semiconductor laser module 1a shown in FIG. 8.

Figure 8:
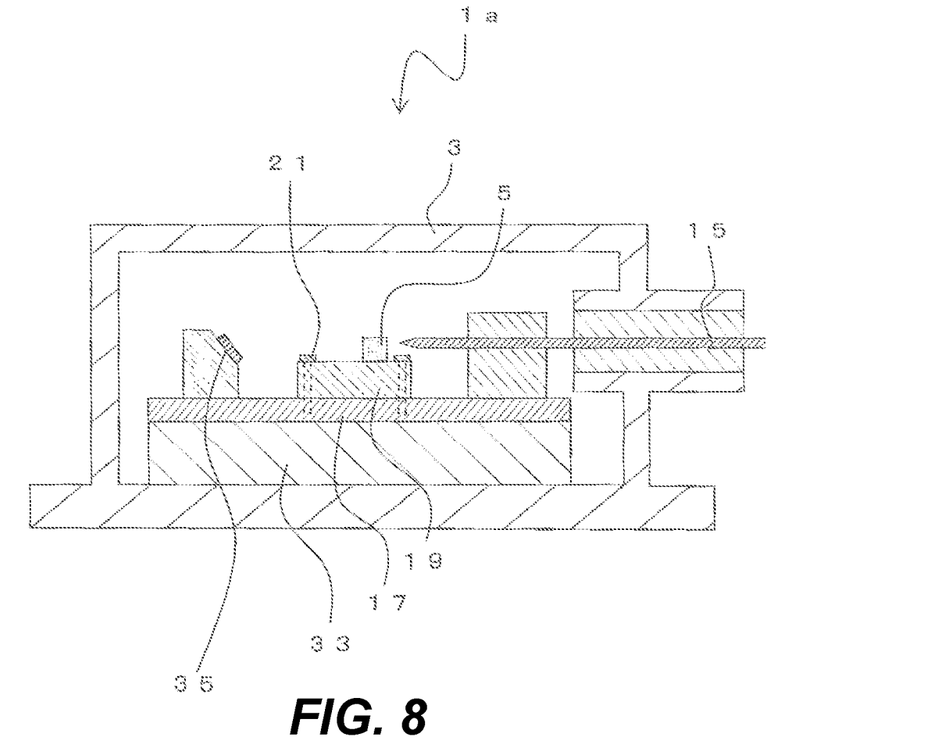

A cooling device 33 is mounted on the package 3 of the semiconductor laser module 1a. The platform 17 is fixed on the cooling device 33. Furthermore, the base 19 equipped with the semiconductor laser 5 is fixed on the platform 17.

The optical fiber 15 is inserted into the package 3 via a cylindrical hole portion in the package 3. A fixing portion for the optical fiber 15 is provided on the base 19 in front of the semiconductor laser 5 (in the emission direction) and the optical fiber 15 is fixed thereto. The optical fiber 15 is, for example, a lensed fiber. There may be more optical elements, such as lenses, disposed between the semiconductor laser 5 and the optical fiber 15.

A photodetector 35 detects the optical output from the semiconductor laser 5 and monitors the optical output of the semiconductor laser 5. The photodetector 35 is provided on the side of a high reflective coating of the semiconductor laser 5. The photodetector 35 is, for example, a photodiode.

In the present embodiment, the fixing members 21 fix the base 19 to the platform 17. That is, solder or the like is not required to join the base 19 and the platform 17 or the like. Alternatively, the fixing members 21 may fix the platform 17 to the cooling device 33.

As above, the fixing members 21 instead of solder fix the optical unit 23 or the optical unit with a platform 23a, and thus the optical unit can be attached or detached and there is a wide range of choice for the materials. Thus, the presently described embodiments excel in heat dissipation and enables to replace only the optical unit or the like when broken.

Although the embodiments have been described on the basis of typical sizes referring to the attached drawings, the technical scope of the claims is not limited to the embodiments described above. It is obvious that persons skilled in the art can think out various examples of changes or modifications within the scope of the technical idea disclosed in the description, and it will be understood that they naturally belong to the technical scope of the claims.

For example, the above-mentioned various embodiments can be combined with each other. Also, the arrangements and forms of each of the structures in each embodiment are

What is claimed is:

1. An optical unit comprising:
    a thermally conductive base, rectangular in shape, having a pair of short sides and a pair of long sides longer than the short sides;
    a circuit conductor that is provided on the base; and
    a semiconductor laser that is connected to the circuit conductor and is disposed on the base, the semiconductor laser having a rectangular shape and having a pair of short sides and a pair of long sides longer than the short sides, wherein:
    four through holes, configured to receive fixing members, are formed adjacent to respective four corners of the semiconductor laser, each through hole disposed between one of the long sides of the semiconductor laser and the nearest long side of the base, and each through hole disposed, along a short side of the base, closer to the semiconductor laser than the center of the distance between the nearest long side of the semiconductor laser and the nearest long side of the base, four cutouts are formed in the circuit conductor, the circuit conductor comprises a first portion in contact with a first terminal of the semiconductor laser and a second portion in contact with a second terminal of the semiconductor laser,
    two of the four cutouts are formed in the first portion and the others of the four cutouts are formed in the second portion,
    the through holes are formed at the positions of the cutouts on the base, and
    loosening prevention members are disposed in order to prevent the fixing members inserted into the through holes from loosening.

2. The optical unit according to claim 1, wherein:
    a lens that collimates light emitted from the semiconductor laser is joined to the optical unit.

3. The optical unit according to claim 1, wherein: the loosening prevention members are metal layers exposed around the holes and the metal layers are insulated from the circuit conductor on the base.

4. A semiconductor laser module comprising:
    the optical unit according to claim 1;
    an optical fiber to which laser beams emitted from the semiconductor laser are coupled; and
    a package that accommodates the optical unit,
    wherein: the optical unit is directly or indirectly fixed to the package with the fixing members.

5. The semiconductor laser module according to claim 4, further comprising:
    a plurality of the optical units that are accommodated in the package;
    a plurality of reflective mirrors that reflect laser beams emitted from each of the semiconductor lasers respectively; and
    a condensing lens that condenses the laser beams reflected by the plurality of the reflective mirrors, wherein: each of the plurality of the optical units can be individually attached or detached.

6. The semiconductor laser module according to claim 4, wherein:
a thermo-conductive sheet is disposed on a bottom face of the base and the optical unit is in contact with a connection target via the thermo-conductive sheet.

7. The semiconductor laser module according to claim 4, wherein:
the optical fiber is a multi-mode optical fiber.

8. The optical unit according to claim 1, wherein the loosening prevention members are solders or adhesive agents applied onto the periphery of the fixing members.

9. The optical unit according to claim 1, wherein an insulating layer is formed between the circuit conductor and the base.

10. A fixing mechanism for an optical unit, comprising:
a thermally conductive base of the optical unit, a circuit conductor provided on the base, and a semiconductor laser connected to the circuit conductor and disposed on the base,
wherein the thermally conductive base is rectangular in shape and has a pair of short sides and a pair of long sides longer than the short sides,
wherein the semiconductor laser is rectangular in shape and has a pair of short sides and a pair of long sides longer than the short sides,
wherein four through holes, configured to receive fixing members, are formed adjacent to respective four corners of the semiconductor laser, each through hole disposed between one of the long sides of the semiconductor laser and the nearest long side of the base, and each through hole disposed, along a short side of the base, closer to the semiconductor laser than the center of the distance between the nearest long side of the semiconductor laser and the nearest long side of the base, four cutouts are formed in the circuit conductor, the circuit conductor comprises a first portion in contact with a first terminal of the semiconductor laser and a second portion in contact with a second terminal of the semiconductor laser,
wherein two of the four cutouts are formed in the first portion and the others of the four cutouts are formed in the second portion,
wherein the through holes are formed at the positions of the cutouts on the base,
wherein loosening prevention members are disposed in order to prevent the fixing members that are inserted into the through holes from loosening, and
wherein the optical unit is fixed to a platform, a package, or a cooling device with the fixing members.

* * * * *